United States Patent [19]

Ipri

[11] 4,244,001
[45] Jan. 6, 1981

[54] FABRICATION OF AN INTEGRATED INJECTION LOGIC DEVICE WITH NARROW BASEWIDTH

[75] Inventor: Alfred C. Ipri, Princeton, N.J.

[73] Assignee: RCA Corporation, New York, N.Y.

[21] Appl. No.: 80,101

[22] Filed: Sep. 28, 1979

Related U.S. Application Data

[62] Division of Ser. No. 914,901, Jun. 12, 1978.

[51] Int. Cl.³ ............... H01L 27/04; H01L 21/22
[52] U.S. Cl. ................................ 357/44; 148/187;
148/33; 29/571; 357/43; 357/46; 357/59;
357/92; 357/23; 357/91
[58] Field of Search ............... 148/187, 1.5; 29/571;
357/44, 43, 59, 91, 92

[56] References Cited

U.S. PATENT DOCUMENTS

| 3,445,734 | 5/1969 | Pecoraro et al. | 148/187 X |
| 3,663,869 | 5/1972 | Strull | 357/43 |
| 3,731,164 | 5/1973 | Cheney | 357/43 |
| 3,738,880 | 6/1973 | Laker | 148/187 |
| 3,846,821 | 11/1974 | Nagata et al. | 148/187 X |
| 4,069,495 | 1/1978 | Masuoka | 357/46 |
| 4,124,933 | 11/1978 | Nicholas | 148/187 |
| 4,183,037 | 1/1980 | LeCan et al. | 357/44 |

*Primary Examiner*—G. Ozaki
*Attorney, Agent, or Firm*—Birgit E. Morris; D. S. Cohen; Lawrence P. Benjamin

[57] ABSTRACT

The basewidth of a lateral, bipolar transistor is markedly reduced by first forming a layer of polycrystalline silicon over an oxide coated substrate. By utilizing a process for doping the exposed edges of the patterned polysilicon layer, a narrower basewidth dimension is achieved than heretofore possible with photolithographic techniques.

4 Claims, 11 Drawing Figures

FABRICATION OF AN INTEGRATED INJECTION LOGIC DEVICE WITH NARROW BASEWIDTH

This is a division of application Ser. No. 914,901, filed June 12, 1978.

This invention relates to semiconductor devices and more particularly to the fabrication of a lateral bipolar transistor having a narrow basewidth.

Integrated Injection Logic (I$^2$L) devices using linear bipolar transistors have been known for some time and are finding increasing use especially in switching circuits. While these devices have the advantage of faster operation and lower power comsumption than T$^2$L logic, for example, I have found that I am able to achieve higher speed and higher packing densities than heretofore possible. This is accomplished by fabricating the devices using a technique that produces a significant reduction in the basewidth in the transistor.

I$^2$L in its simplest form, is a pair of complementary bipolar transistors. A vertical NPN transistor operates as an inverter while a lateral PNP transistor serves as both a current source and a load for the NPN transistor. No ohmic resistors are required for either the current source or load function, hence, high packing densities are achieved.

In the past, lateral transistors were constructed using photolithographic techniques to define the base region. However, since injected carriers (in the base region) have a finite lifetime it is desirable to improve the lifetime of the present bipolar devices by constructing it with a narrow basewidth in order to reduce the electron transit time. A narrow basewith transistor will result in higher switching speed as well as higher gain. Using the prior art photolithographic techniques a basewidth of about 5 $\mu$m is obtainable. With the described process a basewidth of about 0.5 $\mu$m is easily obtainable.

FIG. 9$a$ is a plan view of an I$^2$L stage ring oscillator;

FIG. 9$b$ is a cross section of FIG. 9$a$ taken through lines 9$b$; and

FIG. 9$c$ is a partial schematic diagram of the ring oscillator of FIGS. 9$a$ and 9$b$.

While the foregoing exegesis will be presented in terms of utilizing bulk silicon, it will be obvious to those skilled in the art that this device may be fabricated on an insulative substrate such as spinel or monocrystalline beryllium oxide or sapphire to form a device generally referred to as silicon-on-sapphire. Additionally, while there will be described the fabrication of a lateral NPN bipolar transistor, I do not wish to be so limited since it is readily obvious that a lateral PNP bipolar transistor may also be fabricated using the teachings of my invention.

Figure 1:
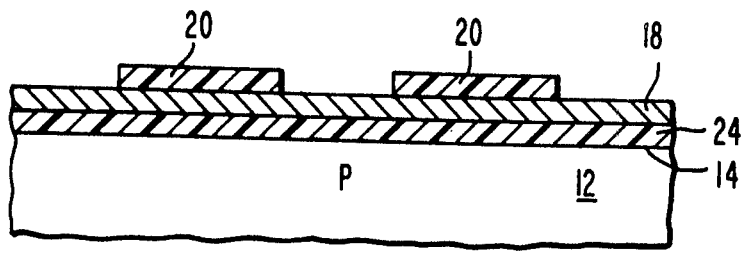
FIGS. 1-4 depict the processing stage for one embodiment of my invention wherein the emitter and collector regions are doped to the same level.

Referring now to FIG. 1, there is shown one method of fabricating a narrow base width, lateral bipolar transistor wherein a body of semiconductor material 12 is provided with a common boundary surface 14 thereon. Surface 14 is provided with a layer of dielectric or dielectrics 24 which may be formed either by the oxidation of surface 14 of silicon body 12 or by the thermal decomposition of silane in an oxidizing atmosphere. Having formed layer 24, the exposed surface thereof is now provided with a polycrystalline silicon (polysilicon) layer 18 followed by a layer 20 of masking oxide, utilizing any one of many well known techniques. Layer 20 is then provided with a patterned layer of photoresist (not shown) and the exposed portions of masking oxide layer 20 is then etched down to the polysilicon layer 18 in order to allow the remaining unetched portions of layer 20 to act as a mask for the subsequent etching of polycrystalline layer 18. At this point, the exposed portions of polysilicon layer 18 are removed by etching in a buffered potassium hydroxide etchant which not only removes the exposed polycrystalline but will generally etch under (undercut) the edges of polysilicon layer 18 under masking layer 20.

Figure 2:
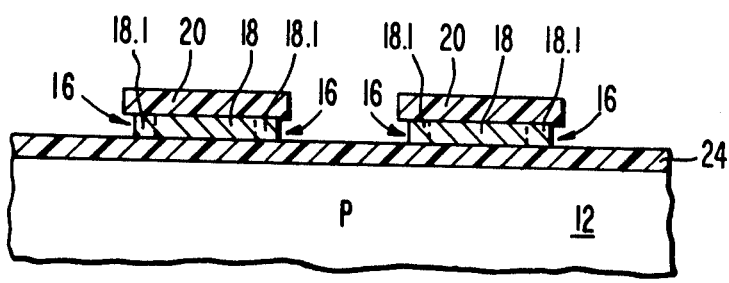

Referring now to FIG. 2 it will be seen that the device is now subjected to a P type dopant (as indicated by arrows 16) and heated. The particular dopant used is boron in the form of diborane. As indicated by the arrows 16 the doped gas will contact only the exposed, undercut edges of polysilicon layer 18 so that the dopant will diffuse laterally into layer 18 from the exposed edges inwardly thereof. This procedure serves to form P type doped polysilicon lines 18.1. Since the diffusion constant of polysilicon layers is well known, the diffusion of the dopant into layer 18 may be accurately controlled by monitoring both the time and temperature of the diffusion step. Accordingly, the doped polysilicon strips 18.1 can be accurately controlled to provide narrow widths.

Figure 3:
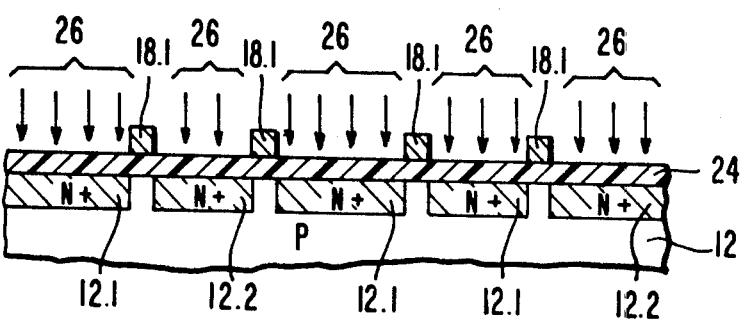
Figure 4:
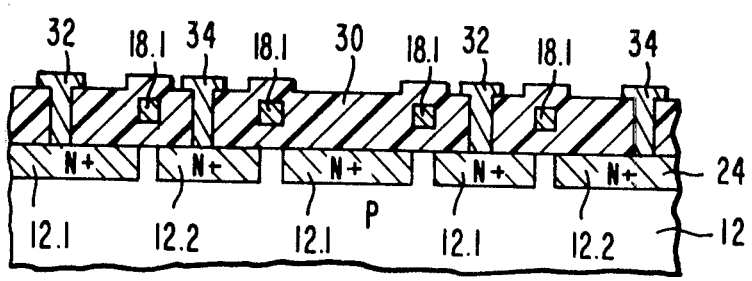
Figure 5:
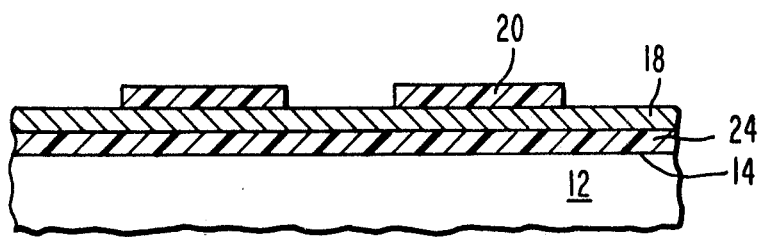
FIGS. 5-8 depict another embodiment of my invention wherein the emitter and collector regions are doped to different levels.
Figure 6:
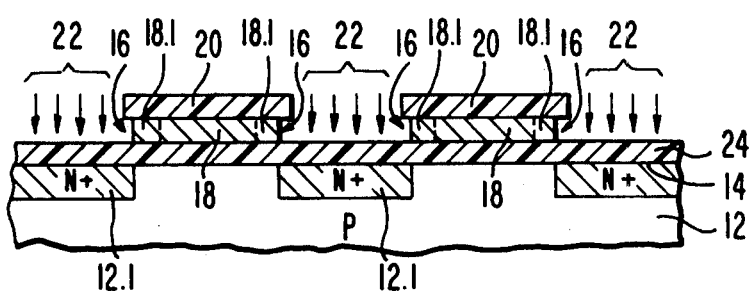

As shown in FIG. 3 doped strips 18.1 appear wherever the exposed edges of polysilicon layer 18 react with the boron dopant. In this particular embodiment I have chosen to dope the emitter and collector electrodes to the same level. As indicated, after the boron doping leading to the formation of doped lines 18.1, masking silicon dioxide layer 20 is removed by using a buffered hydrogen fluoride solution to expose the doped (18.1) and undoped (18) portions of the polysilicon layer. The structure is now subjected to an etching solution consisting of, for example, aqueous hydrazine or a potassium hydroxide-propanol solution in order to remove the undoped polysilicon and allow the doped lines 18.1 to remain. This is desired in detail in U.S. Pat. No. 3,738,880. Using doped lines 18.1 as a mask, the device is now subjected to phosphorus implant as indicated by arrows 26, to delineate the edges of the base region and to form both the emitter and collector regions 12.1 and 12.2 respectively. An implantation of phosphorus ions at a dose of about $1 \times 10^{16}$ ions/cm$^2$ at about 50 KeV results in the concentration of about $10^{20}$/cm$^2$ of conductivity modifiers in both the collector and emitter. Thereafter, as shown in FIG. 4, the device is completed by growing and additional field oxide layer (30) over both oxide layer 24 and polysilicon strips 18.1, in a well known manner, followed by the formation of contact openings and the deposition of metallic contacts 32 and 34, in ohmic contact with emitters 12.1 and collector 12.2 respectively. As is obvious to those skilled in the art, ohmic contacts (not shown) are also provided to substrate 12 which represents the base region of the described transistor. Another embodiment, in which the emitters and collectors are doped to different levels, is shown in FIGS. 5-8. FIG. 5 is the same as FIG. 1 wherein semiconductor body 12, having a boundary layer 14, is provided with a layer of silicon dioxide 24 which in turn is covered with a polysilicon layer 18 and a patterned layer of masking oxide 20. As in FIG. 2, FIG. 6 discloses the etched portions of polysilicon layer 18 and the doping of the exposed edges with diborane (arrows 16) to form doped polysilicon strips 18.1. At this point the processing steps for the different embodiments diverge. As shown in FIG. 6, after the emitter openings are made, a first implant step is performed as indicated by arrows 22. In this step, phosphorus ions implanted at a dose of about $1 \times 10^{16}$ ions/cm$^2$ at 50 KeV will result in a concentration of about $10^{20}$/cm$^3$ of conductivity modifiers in emitter 12.1.

Figure 7:
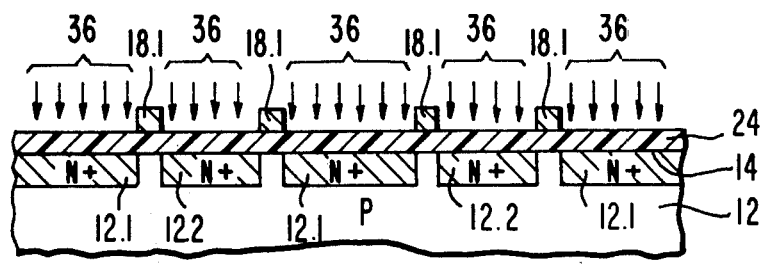

As shown in FIG. 7, the masking oxide layer 20 is now removed by using a buffered hydrogen fluoride solution to expose both the doped (18.1) and undoped (18) portions of the polysilicon layer 18. Thereafter the next step is to remove all of the undoped polysilicon and this may be done by subjecting the structure to a suitable etching solution until such time as all undoped polysilicon is removed. Such solvents are described in U.S. Pat. No. 3,738,880 and include aqueous hydrazine or potassium hydroxide-propanol solutions and the like. The use of any of these solutions will selectively remove only the undoped portions of polysilicon leaving doped polysilicon strips 18.1 unaffected. As shown by arrows 36 the entire device, including previously doped emitter areas 12.1 are subjected to another phosphorus ion implantation at a dose of about $10^{14}$ ions/cm$^2$ at 50 KeV resulting in the formation of the collector region as well as the base region (between the emitter and the collector 12.1 and 12.2 respectively). As a result of the second implant, the collector region will have a concentration of about $10^{18}$/cm$^3$ conductivity modifiers wherein while emitter 12.1 will have a concentration of about $1.01 \times 10^{20}$/cm$^3$ conductivity modifiers.

Figure 8:
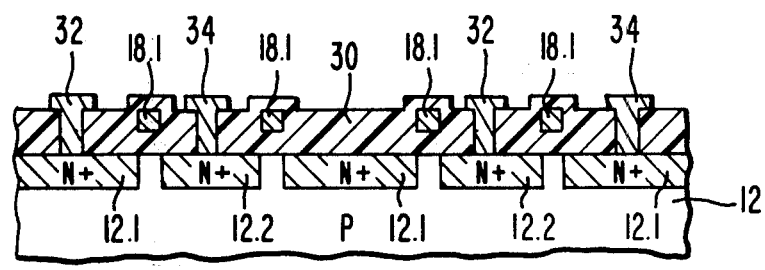

Thereafter, as shown in FIG. 8, the device is completed by growing additional field oxide over both oxide layer 24 and polysilicon strips 18.1, in a well known manner, followed by the formation of contact openings and the deposition of metallic contacts in ohmic contact with emitters 12.1 and collectors 12.2. As is obvious, ohmic contacts (not shown) are also provided to substrate 12 which represents the base region of the described transistor.

Figure 9A:
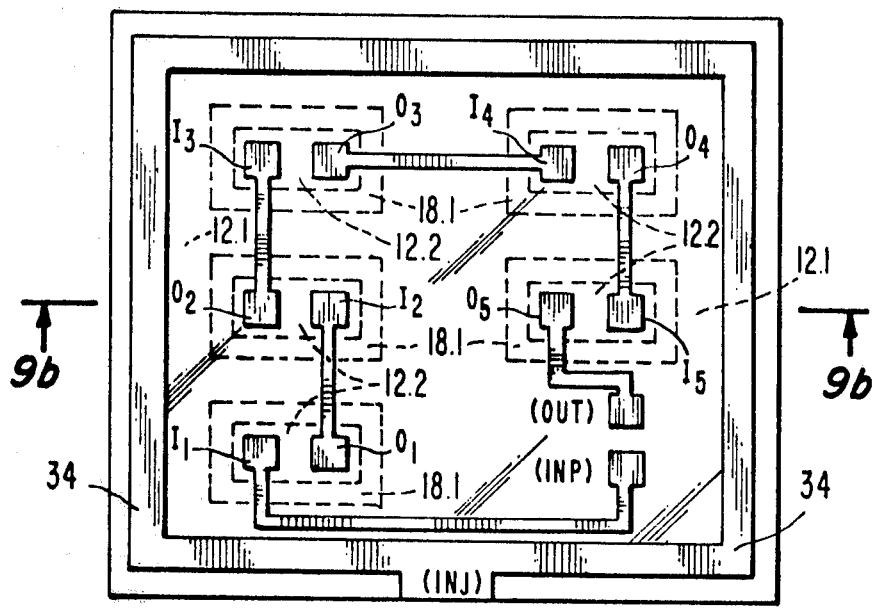
Figure 9B:
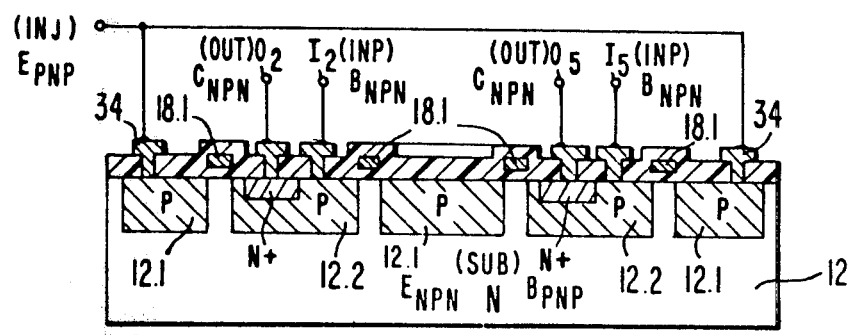
Figure 9C:
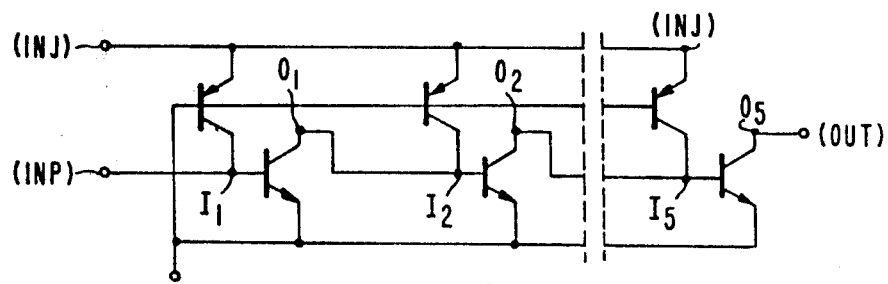

Referring now to FIGS. 9a, 9b, and 9c, wherein FIG. 9b represents a cross section through the plan view presentation of FIG. 9a. This embodiment relates to the fabrication of a standard I$^2$L inverter containing a lateral PNP transistor and an inverter NPN transistor. Using the narrow polysilicon line techniques previously described with regard to FIGS. 1 through 8 it will be seen that to fabricate the device shown in cross section in FIG. 9b it is merely necessary to add some steps between the steps shown in FIGS. 3 and 4. For example, as shown in FIG. 3 after the emitters and collectors have been implanted it is merely necessary to mask the surface of oxide layer 24, and provide openings in the previously implanted collectors of the NPN transistors. The next step would be to implant an N region in the openings using phosphorus as a conductivity modifier. The device is then completed by growing the oxide and etching therethrough and metallizing to form ohmic contacts as shown in FIG. 9b.

The structure in FIGS. 9a and 9c depicts a simple 5 stage ring oscillator wherein the output of each inverter ($O_1$, $O_2$ . . . etc.) is applied as an input to the next adjacent inverter ($I_1$, $I_2$ . . . etc.).

As shown, the emitter of the PNP device is provided with an ohmic connection thereto (labelled INJ) and the input, labelled INP, is connected to $I_1$, the collector of the PNP device and the base of the NPN device. The base of the PNP device and emitter of the NPN device is common and abelled SUB is also provided with an ohmic contact (not shown).

What is claimed is:

1. A method of fabricating an Integrated Injection Logic device having a lateral PNP transistor with a narrow base width region and a vertical NPN transistor, comprising the steps of:

providing a semiconductor body of a given conductivity type, the body having a common boundary surface;

depositing a layer of oxide on the common boundary surface;

depositing a layer of polycrystalline silicon on the oxide layer;

depositing a layer of apertured masking material on the polycrystalline silicon layer;

etching the unmasked portions of the polycrystalline silicon layer to expose unetched edges of polycrystalline silicon under the masking layer;

doping the exposed edges of the unetched polycrystalline silicon layer to form a narrow line of doped polycrystalline silicon in the polycrystalline silicon layer, the narrow doped line defining the limits of the width of the base region of the PNP transistor;

modifying regions of the semiconductor body to an opposite conductivity type to form the emitter and collector regions of the PNP transistor, the collector of the PNP transistor also functioning as the base region of the NPN transistor;

depositing a layer of apertured masking material on the layer of oxide, the exposed portions thereof aligned with portions of the collector region of the PNP transistor;

modifying the exposed portion of the collector region of the PNP transistor to the given conductivity type to form the collector region of the NPN transistor, the remaining portion of the body of semiconductor material being common to the base region of the PNP transistor and the emitter region of the NPN transistor; and providing each region with respective ohmic contact.

2. The product formed by the process of claim 1.

3. The method of claim 1 wherein the modification of the semiconductor body to form the emitter and collector regions comprises the steps of:

doping the semiconductor body, through the etched unmasked portions of the polycrystalline silicon layer, to an opposite conductivity type to form the emitter region;

removing the layer of masking material;

removing only the undoped portions of the polycrystalline silicon layer to expose the collector region; and doping the semiconductor body, through the last unmasked portions of the polycrystalline silicon layer, to an opposite conductivity to form the collector region while simultaneously further doping the emitter region.

4. The product formed by the process of claim 3.

* * * * *